US006400133B1

(12) United States Patent
Vest et al.

(10) Patent No.: US 6,400,133 B1
(45) Date of Patent: Jun. 4, 2002

(54) TEST LEAD RETRACTION SYSTEM

(76) Inventors: Larry W. Vest, 176 April Point South, Montgomery, TX (US) 77356; Rodney Sanders, 26 W. Ottawa, Mc Alester, OK (US) 74501

( * ) Notice: Subject to any disclaimer, the term of this patent is extended or adjusted under 35 U.S.C. 154(b) by 0 days.

(21) Appl. No.: 09/435,001

(22) Filed: Nov. 5, 1999

(51) Int. Cl.$^7$ ............................ G01R 1/04; G01R 1/06; H01R 41/00; H01R 13/72; B65H 75/00

(52) U.S. Cl. ........................ 324/157; 324/149; 242/400; 242/594.3; 439/501

(58) Field of Search ................................ 324/72.5, 149, 324/156, 157, 555; 191/12.2 R, 12.4; 242/378.4, 388.6, 388.7, 399, 400, 594.3; 439/4, 501, 504

(56) References Cited

U.S. PATENT DOCUMENTS

| | | | | | |
|---|---|---|---|---|---|
| 2,124,715 | A | * | 7/1938 | Scheerer | 191/12.4 X |
| 3,392,334 | A | * | 7/1968 | Bevins | 324/72.5 X |
| 3,733,478 | A | * | 5/1973 | Barker | 191/12.4 X |
| D247,218 | S | | 2/1978 | Barber | |
| 4,105,968 | A | | 8/1978 | Mobley et al. | |
| 4,416,057 | A | | 11/1983 | Tardy | |
| 4,433,296 | A | * | 2/1984 | Kolibas | 324/149 X |
| 4,581,497 | A | * | 4/1986 | Morrison et al. | 191/12.2 R |
| 5,057,770 | A | | 10/1991 | Kalishman | |
| 5,367,243 | A | * | 11/1994 | Wells et al. | |
| 5,512,839 | A | | 4/1996 | De Maraco | |
| 5,518,417 | A | * | 5/1996 | Liu | 439/501 |
| 5,740,600 | A | | 4/1998 | Rasberry | |
| 5,913,487 | A | * | 6/1999 | Leatherman | 242/378.4 |

* cited by examiner

*Primary Examiner*—Gerard R. Strecker

(57) ABSTRACT

A test lead retraction system for retracting test lead cables on a spool. The test lead retraction system includes a base having an upper surface, a pillar is fixedly mounted to the upper surface, and a first bore extending through the pillar. An axle having a first end and a second end is fixedly mounted in the first bore. A first spool and a second spool are rotatably mounted on the axle between the pillar and the first end and the second end, respectively, of the axle. First and second biasing mechanisms rotationally bias the first spool and the second spool against rotation with respect to the axle in a first rotational direction. A first connecting cable and a second connecting cable are each wrapped about the respective first and second spools. A first linking cable links the first electrical contact and a meter. A second linking cable links the second electrical contact and the meter.

12 Claims, 2 Drawing Sheets

TEST LEAD RETRACTION SYSTEM

BACKGROUND OF THE INVENTION

1. Field of the Invention

The present invention relates to test lead retractors and more particularly pertains to a new test lead retraction system for retracting test lead cables on a spool.

2. Description of the Prior Art

The use of test lead retractors is known in the prior art. More specifically, test lead retractors heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. Nos. 4,105,968; 5,057,770; U.S. Pat. No. Des. 247,214; U.S. Pat. Nos. 4,416,057; 5,512,839; and 5,740,600.

While these devices fulfill their respective, particular objectives and requirements, the aforementioned patents do not disclose a new test lead retraction system. The inventive device includes a base having an upper surface which generally lies in a plane. A pillar is fixedly mounted to the upper surface of the base. A first bore extends through the pillar. An axle having a first end and a second end is fixedly mounted in the first bore. A first spool is rotatably mounted on the axle between the pillar and the first end of the axle. A second spool is rotatably mounted on the axle between the pillar and the second end of the axle. The first and second spools have an outside edge. A ring is mounted on each of the outside edges of the first and second spools. Each of the rings has an electronic connection thereon which extends through the outside edges of the first and second spools toward the pillar. A first biasing means rotationally biases the first spool against rotation with respect to the axle in a first rotational direction. A second biasing means rotationally biases the second spool against rotation with respect to the axle in a first rotational direction. A first connecting cable has a first end that is electrically coupled to the electrical connection in the outside edge of the first spool. A second connecting cable has a first end electrically coupled to the electrical connection in the outside edge of the second spool. A first electrical contact is abutted against the first ring. A second electrical contact is abutted against the second ring. A first linking cable links the first electrical contact and a meter. A second linking cable links the second electrical contact and the meter.

In these respects, the test lead retraction system according to the present invention substantially departs from the conventional concepts and designs of the prior art, and in so doing provides an apparatus primarily developed for the purpose of retracting test lead cables on a spool.

SUMMARY OF THE INVENTION

In view of the foregoing disadvantages inherent in the known types of test lead retractors now present in the prior art, the present invention provides a new test lead retraction system construction wherein the same can be utilized for retracting test lead cables on a spool.

The general purpose of the present invention, which will be described subsequently in greater detail, is to provide a new test lead retraction system apparatus and method which has many of the advantages of the test lead retractors mentioned heretofore and many novel features that result in a new test lead retraction system which is not anticipated, rendered obvious, suggested, or even implied by any of the prior art test lead retractors, either alone or in any combination thereof.

To attain this, the present invention generally comprises a base having an upper surface which generally lies in a plane. A pillar is fixedly mounted to the upper surface of the base. A first bore extends through the pillar. An axle having a first end and a second end is fixedly mounted in the first bore. A first spool is rotatably mounted on the axle between the pillar and the first end of the axle. A second spool is rotatably mounted on the axle between the pillar and the second end of the axle. The first and second spools have an outside edge. A ring is mounted on each of the outside edges of the first and second spools. Each of the rings has an electronic connection thereon which extends through the outside edges of the first and second spools toward the pillar. A first biasing means rotationally biases the first spool against rotation with respect to the axle in a first rotational direction. A second biasing means rotationally biases the second spool against rotation with respect to the axle in a first rotational direction. A first connecting cable has a first end that is electrically coupled to the electrical connection in the outside edge of the first spool. A second connecting cable has a first end electrically coupled to the electrical connection in the outside edge of the second spool. A first electrical contact is abutted against the first ring. A second electrical contact is abutted against the second ring. A first linking cable links the first electrical contact and a meter. A second linking cable links the second electrical contact and the meter.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new test lead retraction system apparatus and method which has many of the advantages of the test lead retractors mentioned heretofore and many novel features that result in a new test lead retraction system which is not anticipated, rendered obvious, suggested, or even implied by any of the prior art test lead retractors, either alone or in any combination thereof.

It is another object of the present invention to provide a new test lead retraction system which may be easily and efficiently manufactured and marketed.

It is a further object of the present invention to provide a new test lead retraction system which is of a durable and reliable construction.

An even further object of the present invention is to provide a new test lead retraction system which is susceptible of a low cost of manufacture with regard to both materials and labor, and which accordingly is then susceptible of low prices of sale to the consuming public, thereby making such test lead retraction system economically available to the buying public.

Still yet another object of the present invention is to provide a new test lead retraction system which provides in the apparatuses and methods of the prior art some of the advantages thereof, while simultaneously overcoming some of the disadvantages normally associated therewith.

Still another object of the present invention is to provide a new test lead retraction system for retracting test lead cables on a spool.

Yet another object of the present invention is to provide a new test lead retraction system which includes a base having an upper surface which generally lies in a plane. A pillar is fixedly mounted to the upper surface of the base. A first bore extends through the pillar. An axle having a first end and a second end is fixedly mounted in the first bore. A first spool is rotatably mounted on the axle between the pillar and the first end of the axle. A second spool is rotatably mounted on the axle between the pillar and the second end of the axle. The first and second spools have an outside edge. A ring is mounted on each of the outside edges of the first and second spools. Each of the rings has an electronic connection thereon which extends through the outside edges of the first and second spools toward the pillar. A first biasing means rotationally biases the first spool against rotation with respect to the axle in a first rotational direction. A second biasing means rotationally biases the second spool against rotation with respect to the axle in a first rotational direction. A first connecting cable has a first end that is electrically coupled to the electrical connection in the outside edge of the first spool. A second connecting cable has a first end electrically coupled to the electrical connection in the outside edge of the second spool. A first electrical contact is abutted against the first ring. A second electrical contact is abutted against the second ring. A first linking cable links the first electrical contact and a meter. A second linking cable links the second electrical contact and the meter.

Still yet another object of the present invention is to provide a new test lead retraction system that uses spools to wind the cables and in doing so protects the cables from fraying.

Even still another object of the present invention is to provide a new test lead retraction system that can be mounted to any electric meter.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
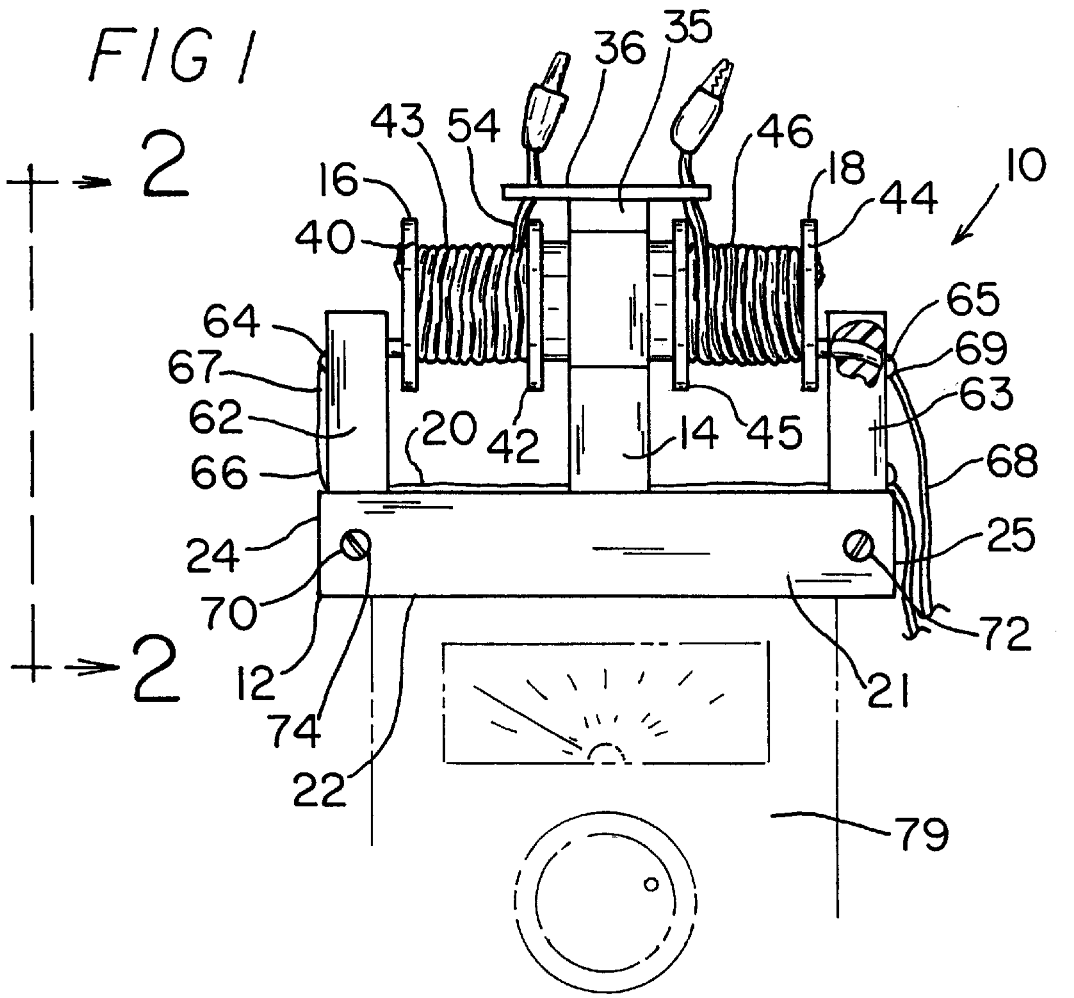
FIG. 1 is a schematic front view of a new test lead retraction system according to the present invention.
Figure 2:
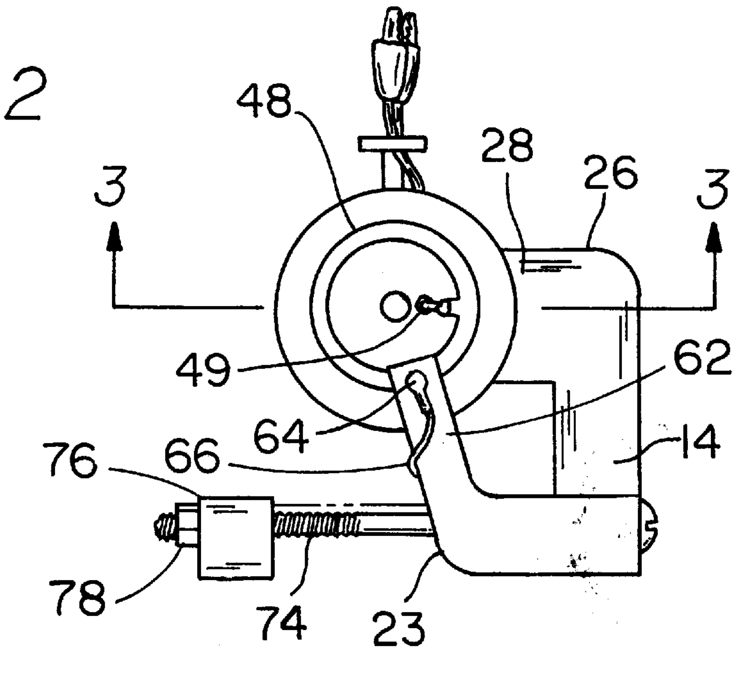
FIG. 2 is a schematic side view of the present invention taken from the perspective of line 2—2 shown in FIG. 1.
Figure 3:
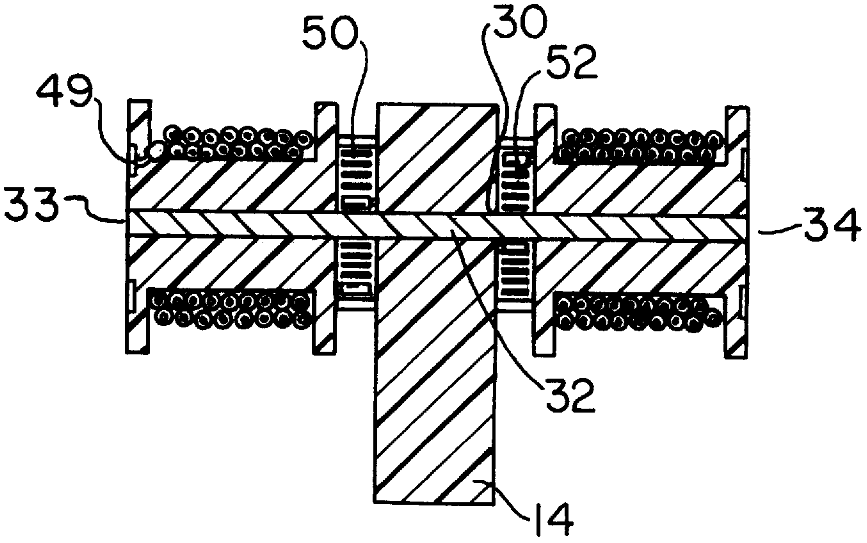
FIG. 3 is a schematic cross-section view taken line 3—3 of the present invention.
Figure 4:
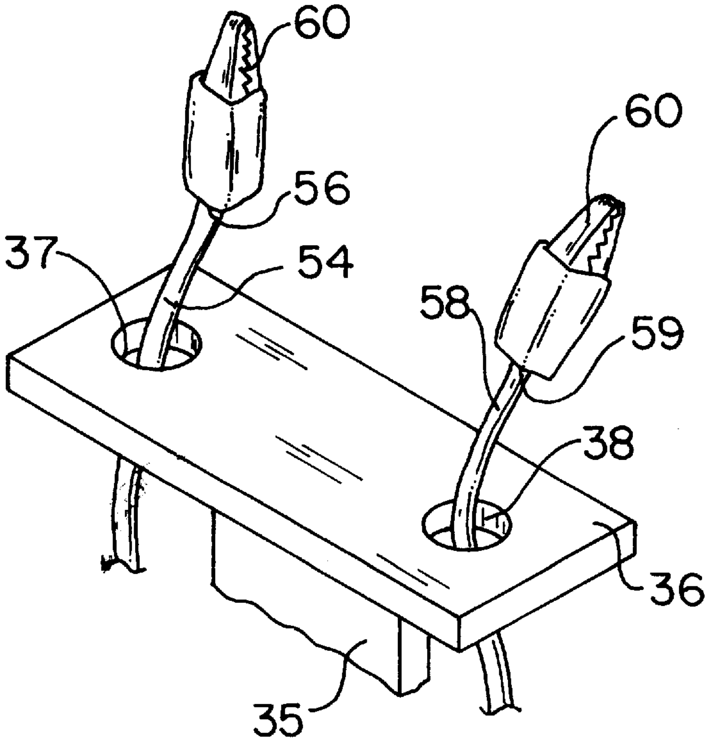
FIG. 4 is a schematic perspective view of the platform of the present invention.

With reference now to the drawings, and in particular to FIGS. 1 through 4 thereof, a new test lead retraction system embodying the principles and concepts of the present invention and generally designated by the reference numeral 10 will be described.

As best illustrated in FIGS. 1 through 4, the test lead retraction system 10 generally comprises a base 12, a pillar 14, spools 16, 18 mounted to the pillar and test leads wrapped about the spool.

The base 12 has a first side 20, a second side 21, a third side 22, and a fourth side 23, a first end 24 and a second end 25. The base has a generally rectangular shape, wherein the first side 20 is an upper surface of the base. The first 20 and third 22 sides are opposite and the second 21 and fourth 23 sides are opposite.

The pillar 14 is fixedly mounted to the upper surface 20 of the base 12, and is preferably located at a medial location on the first side 20 of the base 12. The pillar is located generally adjacent to the second side 21 of the base and is oriented generally perpendicular to a plane of the upper surface 20. The pillar 14 has an end extending 26 away from the base.

Ideally, an arm 28 extends from the end 26 of the pillar 14. The arm 28 is oriented generally horizontal to the plane of the first side 20 and extends away from a plane of the second side 21 of the base 12.

A first bore 30 extends through the arm 28, and is oriented generally parallel to the plane of the second side 21.

An axle 32 is inserted in the first bore, and the axle is fixedly mounted in the first bore 30. The axle has a first end 33 and a second end 34.

Preferably, a pole 35 is fixedly coupled to the arm 28. The pole 35 is oriented generally perpendicular to a plane of the first side 20 of the base 12. The pole extends away from the upper surface 20 of the base 12.

Ideally, a platform 36 is fixedly coupled to the pole and lies in a plane extending generally parallel to the plane of the upper surface 20 of the base 12. The platform 36 extends from the pole 35 toward the first end 24 of the base and from the pole toward the second end 25 of the base 12.

A second bore 37 and a third 38 bore receive the cables. The second bore 37 is located in a portion of the platform between the pillar 14 and the first end 24 of the base 12, and the second bore 38 is in a portion of the platform 36 between the pillar 14 and the second end 25 of the base.

The first spool 16 for holding a test lead cable is rotatably mounted on the axle 32. The first spool 16 is generally located between the pillar 14 and the first end 33 of the axle 32. Preferably, the first spool 16 has an outside edge 40 and an inside edge 42, wherein the outside edge 40 of the first spool 16 is located generally adjacent to the first end 33 of the axle 32. Ideally the first spool 16 has a middle portion 43, wherein the middle portion 43 of the first spool has a diameter less than a diameter of the outside 40 and the inside 42 edges of the spool 16.

The second spool 18 for holding a test lead cable is rotatably mounted on the axle 32. The second spool is generally located between the pillar 14 and the second end 34 of the axle 32. The second spool 18 has an outside edge 44 and an inside edge 45, wherein the outside edge 44 of the second spool 18 is located generally adjacent to the second end 34 of the axle 32. Ideally, the second spool 18 has a middle portion 46, wherein the middle portion 46 of the second spool 18 has a diameter less than a diameter of the outside 44 and the inside edges 45 of the second spool 18.

A ring 48 is mounted on each of the outside edges of the first 16 and second spools 18. The rings 48 have an electronic connection thereon 49, and each of the electronic connections 49 extend through the outside edges 40, 44 of the first 16 and second spools 18 into the middle portions 43, 46 of the first and second spools. The rings 48 are formed from conductive material.

A first spring 50 rotationally biases the first spool 16 against rotation with respect to the axle 32 in a first rotational direction. The first spring 50 is a spiral coiled spring, and is generally annular and has a generally rectangular shaped cross-section. The first spring has a first end and a second end. The first spring 50 is mounted on the axle 32 between the inside edge 42 of the first spool 16 and the pillar 14, whereby the first end of the first spring 50 is fixedly coupled to the axle 32, and the second end of the first spring 50 is coupled to the inside edge 42 of the first spool 16. Turning the first spool 16 in a first rotational direction tightens the radius of the coils of the first spring 50 such that the first spring is biased against rotation in the first rotational direction.

A second spring 52 rotationally biases the second spool 18 against rotation with respect to the axle 32 in a first rotational direction. The second spring 52 is substantially similar to the first spring. The second spring is mounted on the axle 32 between the inside edge 45 of the second spool 18 and the pillar 14. A first end of the second spring 52 is fixedly coupled to the axle 32, and a second end of the spring is fixedly coupled to the inside edge 45 of the second spool 18. Turning the second spool 52 in a first rotational direction tightens the radius of the coils of the second spring such that the second spring is biased against rotation in the first rotational direction.

A first connecting cable 54 has a first end, a second end 56 and a middle portion. The first end of the first connecting cable is electrically coupled to the electrical connection 49 in the outside edge 40 of the first spool 16. The second end 56 of the first connecting cable 54 is inserted through the second bore 37 of the platform 36. The middle portion of the first connecting cable is wound about the middle portion 43 of the first spool 16.

A second connecting cable 58 has a first end, a second end 59 and a middle portion. The first end of the first connecting cable is electrically coupled to the electrical connection 49 in the outside edge 44 of the second spool 18. The second end 59 of the second connecting cable 58 is inserted through the third bore 38 in the platform 36. The middle portion of the second connecting cable 58 is wound about the middle portion 46 of the second spool 18. The first and second connecting cables are formed from conductive metal and encased in nonconductive material.

Preferably a clamp is fixedly coupled to each of the second ends 56, 59 of the first and second connecting cables. The clamps are ideally alligator clips 60.

Preferably, the base 12 has a first elongate member 62 that extends from the first side 20 of the base 12. The first elongate portion 62 is located generally adjacent to the first end 24 and the fourth side 23 of the base 12. The first elongate portion 62 extends to a point generally adjacent to the first ring 48 in the first spool 16.

The base 12 has a second elongate portion 63 that extends from the first side 20 of the base 12. The second elongate portion is located generally adjacent to the second end 25 and the fourth side 23 of the base 12. The second elongate portion 63 extends to a point generally adjacent to the second ring in the second spool 18.

A first electrical contact 64 is mounted on the first elongate portion 62 of the base 12. The first electrical contact 64 is abutted against the first ring 48 (see FIG. 2) so that the ring may rotate with the first spool, but an electrical connection is maintained by the abutment of the contact 64 with the conductive ring.

A second electrical contact 65 is mounted on the second elongate portion of the base, and is abutted against the second ring (see FIG. 2) so that the ring may rotate with the second spool, but an electrical connection is maintained by the abutment of the contact 65 with the conductive ring.

A first linking cable 66 has a first end 67 and a second end. The first end 67 of the first linking cable 66 is electrically coupled to the first electrical contact 64, wherein the second end of the first linking cable is electrically coupled to the meter 79.

A second linking cable 68 has a first end 69 and a second end. The second end 69 of the first linking cable 68 is electrically coupled to the second electrical contact 65, wherein the second end of the second linking cable is electrically coupled to the meter.

A fourth bore 70 and a fifth bore 72 are in the second side 21 of the base and extend through the fourth side 23 of the base.

A fastening means fastens the base 12 to the meter. The fastening means preferably comprises a pair of screws 74 with one of the screws is inserted in each of the fourth 70 and fifth 72 bores. A pair of mounting blocks 76 are provided for mounting on the ends of the screws opposite the base 12 and in a position adjacent to an opposite face of the meter from the face to which the base is positioned (see FIG. 2). Illustratively, a threaded nut 78 is mounted on the end of the screw (see FIG. 2) such that rotation of the screw draws the respective nut and mounting block closer to or away from the base, to selective pinch an upper portion of the meter housing between the base and the mounting block (see FIGS. 1 and 2).

In use, the test lead connecting cables 54, 58 are pulled off of the spools 16, 18 and connected to the device to be tested. When finished, the connecting cables are released and the springs 50, 52 unwind which pulls the cable back onto the spools.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A test lead cable retraction system comprising:

a base, said base having an upper surface, said upper surface generally lying in a plane;

a pillar, said pillar being fixedly mounted to said upper surface of said base, said pillar having an end extending away from said base;

a first bore, said first bore extending through said pillar;

an axle inserted in said first bore, said axle being fixedly mounted in said first bore, said axle having a first end and a second end;

a first spool for holding a test lead cable, said first spool being rotatably mounted on said axle, said first spool being generally located between said pillar and said first end of said axle, said first spool having an outside edge;

a second spool for holding a test lead cable, said second spool being rotatably mounted on said axle, said second spool being generally located between said pillar and said second end of said axle, said second spool having an outside edge;

a pair of rings, one of said rings being mounted on each of said outside edges of said first and second spools, each of said rings being formed of an electrically conductive material and having an electronic connection thereon, each of said electronic connections extending through said outside edges of said first and second spools toward said pillar;

a first biasing means for rotationally biasing said first spool against rotation with respect to said axle in a first rotational direction;

a second biasing means for rotationally biasing said second spool against rotation with respect to said axle in a first rotational direction;

a first connecting cable, said first connecting cable having a first end being electrically coupled to said electrical connection in said outside edge of said first spool;

a second connecting cable, said second connecting cable having a first end being electrically coupled to said electrical connection in said outside edge of said second spool;

a first electrical contact, said first electrical contact being abutted against said first ring;

a second electrical contact, said second electrical contact being abutted against said second ring;

a first linking cable, said first linking cable linking said first electrical contact and a meter; and a second linking cable, said second linking cable linking said second electrical contact and said meter;

wherein said base has a first side, a second side, a third side, and a fourth side, a first end and a second end.

2. The test lead cable retraction system as in claim 1, wherein said pillar is generally located at a medial location on said first side of said base, said pillar being located generally adjacent to said second side of said base, said pillar being oriented generally perpendicular to a plane of said upper surface, said pillar having an end extending away from said base.

3. The test lead cable retraction system as in claim 2, further comprising:

an arm, said arm extending from said end of said pillar, said arm being oriented generally horizontal to said plane of said first side, said arm extending away from a plane of said second side of said base;

wherein said first bore extends through said arm, said first bore being oriented generally parallel to said plane of said second side.

4. The test lead cable retraction system as in claim 3, further comprising:

a pole, said pole being fixedly coupled to said arm, said pole being oriented generally perpendicular to a plane of said first side of said upper surface of said base, said pole extending away from said upper surface of said base;

a platform, said platform being fixedly coupled to said pole, said platform lying in a plane extending generally parallel to said plane of said upper surface of said base, said platform extending from said pole toward said first end of said base and from said pole toward said second end of said base; and a second bore and a third bore for receiving said cables, said second bore being located in a portion of said platform between said pillar and said first end of said base, said third bore being in a portion of said platform between said pillar and said second end of said base.

5. The test lead cable retraction system as in claim 1, wherein said first and second spools each have an inside edge, wherein said outside edge of said first spool is located generally adjacent to said first end of said axle and said outside edge of said second spool is generally adjacent to said second end of said axle, each of said spools having a middle portion, said middle portions of said first and second spools having a diameter less than a diameter of each of said outside and inside edges of said first and second spools; and wherein each of said electronic connections extend through said outside edges of said first and second spools into said middle portions of said first and second spools, said rings being formed from conductive material.

6. The test lead cable retraction system as in claim 5, wherein said first biasing means comprises a first spring and said second biasing means comprises a second spring, and wherein each of said first and second spring comprises:

a spiral coiled spring, said spiral coiled spring being generally annular and having a generally rectangular shaped cross-section, said spiral coiled spring having a first end and a second end;

wherein said first spring is mounted on said axle between said inside edge of said first spool and said pillar, said first end of said first spring being fixedly coupled to said axle, said second end of said first spring being coupled to said inside edge of said first spool, wherein turning said first spool in a first rotational direction tightens the radius of the coils of said first spring such that said first spring is biased against rotation in said first rotational direction; and wherein said second spring is mounted on said axle between said inside edge of said second spool and said pillar, a first end of said second spring being fixedly coupled to said axle, a second end of said spring being fixedly coupled to said inside edge of said second spool, wherein turning said second spool in a first rotational direction tightens the radius of the coils of said second spring such that said second spring is biased against rotation in said first rotational direction.

7. The test lead cable retraction system as in claim 4, wherein said first and second connecting cables each have a second end and a middle portion, said second end of said first connecting cable being inserted through said second bore of said platform, said second end of said second connecting cable being inserted through said third bore in said platform, wherein said first and second connecting cables are formed from conductive metal and encased in nonconductive material.

8. The test lead cable retraction system as in claim 7, further comprising:

a pair of clamps, one of said clamps being fixedly coupled to each of said second ends of said first and second connecting cables.

9. The test lead cable retraction system as in claim 1, wherein said first and second connecting cables each having a second end, and additionally comprising:

a pair of clamps, one of said clamps being fixedly coupled to each of said second ends of said first and second connecting cables.

10. The test lead cable retraction system as in claim 1, further comprising:

a first elongate portion extending from said first side of said base, said first elongate member being located generally adjacent to said first end and said fourth side of said base, said first elongate member extending to a point generally adjacent to said first ring in said first spool;

a second elongate portion extending from said first side of said base, said second elongate member being located generally adjacent to said second end and said fourth side of said base, said second elongate member extending to a point generally adjacent to said second ring in said second spool;

wherein said first electrical contact is mounted on said first elongate member; and wherein said second electrical contact is mounted on said second elongate member.

11. The test lead cable retraction system as in claim 1, further comprising:

a pair of bores, each of said bores being in said second side of said base and extending through said fourth side of said base; and a fastening means for fastening said base to said meter, said fastening means comprising a pair of screws, one of said screws being inserted in each of said pair of bores.

12. A test lead cable retraction system comprising:

a base, said base having a first side, a second side, a third side, and a fourth side, a first end and a second end, wherein said first side is an upper surface of said base;

a pillar, said pillar being fixedly mounted to said upper surface of said base, said pillar being generally located at a medial location on said first side of said base, said pillar being located generally adjacent to said second side of said base, said pillar being oriented generally perpendicular to a plane of said upper surface, said pillar having an end extending away from said base;

an arm, said arm extending from said end of said pillar, said arm being oriented generally horizontal to said plane of said first side, said arm extending away from a plane of said second side of said base;

a first bore, said first bore extending through said arm, said first bore being oriented generally parallel to said plane of said second side;

an axle inserted in said first bore, said axle being fixedly mounted in said first bore, said axle having a first end and a second end;

a pole, said pole being fixedly coupled to said arm, said pole being oriented generally perpendicular to a plane of said first side of said upper surface of said base, said pole extending away from said upper surface of said base;

a platform, said platform being fixedly coupled to said pole, said platform lying in a plane extending generally parallel to said plane of said upper surface of said base, said platform extending from said pole toward said first end of said base and from said pole toward said second end of said base;

a second bore and a third bore for receiving said cables, said second bore being located in a portion of said platform between said pillar and said first end of said base, said third bore being in a portion of said platform between said pillar and said second end of said base;

a first spool for holding a test lead cable, said first spool being rotatably mounted on said axle, said first spool being generally located between said pillar and said first end of said axle, said first spool having an outside edge and an inside edge, wherein said outside edge of said first spool is located generally adjacent to said first end of said axle, said first spool having a middle portion, said middle portion of said first spool having a diameter less than a diameter of said outside and said inside edges of said spool;

a second spool for holding a test lead cable, said second spool being rotatably mounted on said axle, said second spool being generally located between said pillar and said second end of said axle, said second spool having an outside edge and an inside edge, wherein said outside edge of said second spool is located generally adjacent to said second end of said axle, said second spool having a middle portion, said middle portion of said second spool having a diameter less than a diameter of said outside and said inside edges of an second spool;

a pair of rings, one of said rings being mounted on each of said outside edges of said first and second spools, each of said rings being formed of an electrically conductive material and having an electronic connection thereon, each of said electronic connections extending through said outside edges of said first and second spools into said middle portions of said first and second spools, said rings being formed from conductive material;

a first spring for rotationally biasing said first spool against rotation with respect to said axle in a first rotational direction, said first spring being a spiral coiled spring, said first spring being generally annular and having a generally rectangular shaped cross-section, said first spring having a first end and a second end, said first spring being mounted on said axle between said inside edge of said first spool and said pillar, said first end of said first spring being fixedly coupled to said axle, said second end of said first spring being coupled to said inside edge of said first spool, wherein turning said first spool in a first rotational direction tightens the radius of the coils of said first spring such that said first spring is biased against rotation in said first rotational direction;

a second spring for rotationally biasing said second spool against rotation with respect to said axle in a first rotational direction, said second spring being substantially similar to said first spring, said second spring being mounted on said axle between said inside edge of said second spool and said pillar, a first end of said second spring being fixedly coupled to said axle, a second end of said spring being fixedly coupled to said inside edge of said second spool, wherein turning said second spool in a first rotational direction tightens the radius of the coils of said second spring such that said second spring is biased against rotation in said first rotational direction;

a first connecting cable, said first connecting cable having a first end, a second end and a middle portion, said first end of said first connecting cable being electrically coupled to said electrical connection in said outside edge of said first spool, said second end of said first connecting cable being inserted through said second bore of said platform, said middle portion of said first connecting cable being wound about said middle portion of said first spool;

a second connecting cable, said second connecting cable having a first end, a second end and a middle portion, said first end of said first connecting cable being electrically coupled to said electrical connection in said outside edge of said second spool, said second end of said second connecting cable being inserted through said third bore in said platform, said middle portion of said second connecting cable being wound about said middle portion of said second spool, wherein said first and second connecting cables are formed from conductive metal and encased in nonconductive material;

a pair of clamps, one of said clamps being fixedly coupled to each of said second ends of said first and second connecting cables, said clamps being alligator clips;

a first elongate member, said first elongate member extending from said first side of said base, said first elongate member being located generally adjacent to said first end and said fourth side of said base, said first elongate member extending to a point generally adjacent to said first ring in said first spool;

a second elongate member, said second elongate member extending from said first side of said base, said second elongate member being located generally adjacent to said second end and said fourth side of said base, said second elongate member extending to a point generally adjacent to said second ring in said second spool;

a first electrical contact, said first electrical contact being mounted on said first elongate member, said first electrical contact being abutted against said first ring;

a second electrical contact, said second electrical contact being mounted on said second elongate member, said second electrical contact being abutted against said second ring;

a first linking cable, said first linking cable having a first end and a second end, said first end of said first linking cable being electrically coupled to said first electrical contact, wherein said second end of said first linking cable is electrically coupled to a meter;

a second linking cable, said second linking cable having a first end and a second end, said second end of said first linking cable being electrically coupled to said second electrical contact, wherein second end of said second linking cable is electrically coupled to said meter;

a fourth bore and a fifth bore, each of said fourth and fifth bore being in said second side of said base and extending through said fourth side of said base; and a fastening means for fastening said base to said meter, said fastening means comprising a pair of screws, one of said screws being inserted in each of said fourth and fifth bores.

* * * * *